US012622020B2

(12) United States Patent
Fiorenza et al.

(10) Patent No.: US 12,622,020 B2
(45) Date of Patent: May 5, 2026

(54) SILICON CARBIDE MOSFET TRANSISTOR DEVICE WITH IMPROVED CHARACTERISTICS AND CORRESPONDING MANUFACTURING PROCESS

(71) Applicant: STMicroelectronics S.r.l., Agrate Brianza (IT)

(72) Inventors: Patrick Fiorenza, Belpasso (IT); Fabrizio Roccaforte, Mascalucia (IT); Edoardo Zanetti, Valverde (IT); Mario Giuseppe Saggio, Aci Bonaccorsi (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 1169 days.

(21) Appl. No.: 17/559,859

(22) Filed: Dec. 22, 2021

(65) Prior Publication Data

US 2022/0208961 A1    Jun. 30, 2022

(30) Foreign Application Priority Data

Dec. 24, 2020    (IT) ........................ 102020000032441

(51) Int. Cl.
H10D 62/10          (2025.01)
H01L 21/04          (2006.01)
(Continued)

(52) U.S. Cl.
CPC ......... H10D 62/109 (2025.01); H01L 21/046 (2013.01); H01L 21/7602 (2013.01);
(Continued)

(58) Field of Classification Search
CPC .. H10D 30/662; H10D 30/66; H10D 30/0291; H10D 12/031; H10D 62/393; H10D 62/157
See application file for complete search history.

(56) References Cited

U.S. PATENT DOCUMENTS 6,072,216 A      6/2000  Williams et al.
2015/0287817 A1    10/2015  Kubota et al.
(Continued)

FOREIGN PATENT DOCUMENTS

CN         102779852 A     11/2012
CN         109216351 A     1/2019
JP         2012064741 A     3/2012

OTHER PUBLICATIONS

Ward, "Meeting the need for low-cost MOSFETs," *Compound Semiconductor*, Jan./Feb. 2015, pp. 41-44.

*Primary Examiner* — Antonio B Crite

(74) *Attorney, Agent, or Firm* — Seed IP Law Group LLP

(57) ABSTRACT

A MOSFET transistor device includes a functional layer of silicon carbide, having a first conductivity type. Gate structures are formed on a top surface of the functional layer and each includes a dielectric region and an electrode region. Body wells having a second conductivity type are formed within the functional layer, and the body wells are separated from one another by surface-separation regions. Source regions having the first conductivity type are formed within the body wells, laterally and partially underneath respective gate structures. Modified-doping regions are arranged in the surface-separation regions centrally thereto, underneath respective gate structures, in particular underneath the corresponding dielectric regions, and have a modified concentration of dopant as compared to the concentration of the functional layer.

18 Claims, 6 Drawing Sheets

(51) Int. Cl.

| | |
|---|---|
| *H01L 21/76* | (2006.01) |
| *H01L 21/761* | (2006.01) |
| *H10D 12/01* | (2025.01) |
| *H10D 30/01* | (2025.01) |
| *H10D 30/66* | (2025.01) |
| *H10D 62/13* | (2025.01) |
| *H10D 62/17* | (2025.01) |
| *H10D 62/832* | (2025.01) |

(52) U.S. Cl.
CPC ......... *H01L 21/761* (2013.01); *H10D 12/031* (2025.01); *H10D 30/66* (2025.01); *H10D 62/393* (2025.01); *H10D 62/8325* (2025.01)

(56) References Cited

U.S. PATENT DOCUMENTS

| | | | |
|---|---|---|---|
| 2017/0229541 A1* | 8/2017 | Nakamura | .......... H01L 21/0465 |
| 2018/0061934 A1 | 3/2018 | Ueno | |
| 2019/0109224 A1 | 4/2019 | Tomita et al. | |
| 2019/0123146 A1 | 4/2019 | Uchida et al. | |
| 2020/0161442 A1 | 5/2020 | Gorczyca | |

\* cited by examiner

SILICON CARBIDE MOSFET TRANSISTOR DEVICE WITH IMPROVED CHARACTERISTICS AND CORRESPONDING MANUFACTURING PROCESS

BACKGROUND

Technical Field

The present disclosure relates to a silicon carbide MOSFET transistor device with improved characteristics and to a corresponding manufacturing process.

Description of the Related Art

Electronic semiconductor devices are known, in particular MOSFET transistors (Metal-Oxide-Semiconductor Field-Effect Transistors), for example, for electronic power applications, which are made starting from a silicon carbide substrate.

The above devices prove advantageous thanks to the favorable chemico-physical properties of silicon carbide. For instance, silicon carbide generally has a wider bandgap than silicon, which is commonly used in electronic devices. Consequently, even with relatively small thicknesses, silicon carbide has a higher breakdown voltage than silicon and may thus be advantageously used in high-voltage, high-power and high-temperature applications.

In particular, thanks to its crystalline quality and to its large-scale availability, silicon carbide with hexagonal poly-type (4H-SiC) can be used for electronic power applications.

Manufacturing of a silicon carbide semiconductor device is, however, affected by some problems.

For instance, problems of crystallographic quality of silicon carbide may represent an obstacle to obtaining a high production yield, which may in general prove lower than those of similar devices made starting from silicon, consequently causing an increase in the production costs.

In particular, it has been shown that reliability problems are linked to high electrical fields developing at the interfaces between silicon oxide ($SiO_2$) and silicon carbide (4H-SiC).

FIG. 1 shows a portion of a basic or elementary structure (a so-called cell), of a MOSFET device of a vertical type, in particular an N-channel VDMOS (Vertical Double-Diffused Metal Oxide Semiconductor) device, for power applications, designated by 1 and comprising: a substrate of semiconductor material (in particular, silicon carbide 4H-SiC), which is heavily doped (for example, with $N^+$-type doping, with high doping concentration, for instance higher than $10^{18}$ atoms/$cm^3$), not illustrated herein, and an epitaxial layer (referred to as drift layer) 2, also made of silicon carbide, having the same conductivity type as, and overlying, the substrate, with a lower dopant concentration ($N^-$). The substrate operates as drain for the MOSFET device 1, and the epitaxial layer 2 constitutes a surface extension thereof defining a top surface 2a.

Each cell of the MOSFET device 1 comprises a body well 4 having a conductivity opposite to that of the epitaxial layer 2 (in the example, of a P type), and a source region 5, arranged within the body well 4 at the top surface 2a, having the same conductivity type as the substrate 2 and a high dopant concentration ($N^+$).

The surface portion of the epitaxial layer 2, arranged at the top surface 2a and interposed between adjacent body wells 4, is commonly referred to as JFET region.

The device 1 further comprises a gate structure 6, constituted by a gate dielectric region 7, for example, of silicon oxide, formed on the JFET region and partially overlapping the body well 4 and the source region 5; and a gate electrode 8 provided on the gate dielectric region 7.

A dielectric material region 9, for example, of field oxide, overlies the gate electrode 8; an electrical-contact region 11 is defined through this dielectric material region 9, designed to contact a surface portion of the source region 5.

A source metallization 12 is arranged in contact with the aforesaid electrical-contact region 11; moreover, in a way not illustrated, a drain metallization contacts the substrate from the back and gate metallizations, provided within contact openings provided through the dielectric material region 9, contact the gate electrodes 8.

The channel of each cell of the MOSFET device 1 is formed in the portion of the corresponding body well 4 set directly underneath the gate electrode 8, and is delimited by the junction between the source region 5 and the body well 4 on one side, and by the junction between the same body well 4 and the JFET region, on the other side.

The gate electrode 8 is capacitively coupled to the channel to modulate the conductivity type thereof; in particular, application of an appropriate voltage to the gate electrode 8 allows to cause channel inversion and thus create a conductive path for the electrons between the source region 5 (first current-conduction region of the device) and the substrate (second current-conduction region of the device), through the channel and the drift layer.

A problem afflicting silicon carbide MOSFET devices is linked to the increase in the electrical field on account of the possible crystallographic defects, with the electrical field that tends to increase in the insulating material, in particular in the gate dielectric region 7 at the central part of the JFET region, especially in reverse-biasing configuration.

FIG. 2 shows the trend of the electrical field, designated by E, within the dielectric material in the above defined region. The increase of the electrical field in the central area of the JFET region is clear, where it may even assume levels such as to cause dielectric breakdown and thus jeopardize the reliability of the MOSFET device.

Known solutions for overcoming the aforesaid problem envisage a reduction of the electrical field at the interface between the silicon carbide and the gate dielectric region by one or more of the following approaches: an increase in the thickness of the epitaxial layer (drift layer); a reduction of the doping of the epitaxial layer; and a reduction of the distance between adjacent body wells and therefore of the width of the JFET region.

The above solutions do not, however, prove altogether satisfactory in so far as they generally envisage an undesired increase in the on-resistance of the MOSFET device and moreover have a non-negligible impact on the cost and efficiency of the manufacturing process.

BRIEF SUMMARY

The present disclosure provides various embodiments which solve or at least partially solve or overcome one or more of the problems highlighted above.

According to the present disclosure, a silicon carbide MOSFET transistor device and a corresponding manufacturing process are consequently provided.

In at least one embodiment, a MOSFET transistor device is provided that includes a functional layer of silicon carbide, having a first conductivity type. Gate structures are formed on a top surface of said functional layer, and each of the gate structures includes a dielectric region and an electrode region. Body wells having a second conductivity type are formed within said functional layer, and the body wells are separated from one another by surface-separation regions of said functional layer. Source regions having said first conductivity type are formed within said body wells, laterally and partially underneath respective gate structures. Modified-doping regions are arranged in the surface-separation regions of said functional layer, underneath respective gate structures. The modified-doping regions have a modified concentration of dopant as compared to the concentration of the functional layer.

In at least one embodiment, a process for manufacturing a MOSFET transistor device is provided that includes: forming a functional layer of silicon carbide, having a first conductivity type; forming gate structures on a top surface of said functional layer, each of the gate structures including a dielectric region and an electrode region; forming body wells having a second conductivity type, within said functional layer, the body wells separated from one another by surface-separation regions of said functional layer; forming source regions having said first conductivity type, within said body wells, laterally and partially underneath respective gate structures; and forming modified-doping regions, arranged in the surface-separation regions of said functional layer, underneath respective gate structures, said modified-doping regions having a modified concentration of dopant as compared to the concentration of the functional layer.

BRIEF DESCRIPTION OF THE SEVERAL VIEWS OF THE DRAWINGS

For a better understanding of the present disclosure, a preferred embodiment thereof is now described purely by way of non-limiting example and with reference to the annexed drawings, wherein.

DETAILED DESCRIPTION

As will be described in detail in what follows, an aspect of the present solution envisages a reduction of the electrical field in the gate dielectric region, in particular in reverse-biasing conditions, by introducing a modified-doping region in the JFET region of the MOSFET device (the latter being in particular a 4H-SiC polytype silicon carbide power MOSFET transistor). The modified-doping region is a region having a net concentration of dopant reduced as compared to the concentration of the epitaxial layer in which the JFET region is provided.

Figure 1:
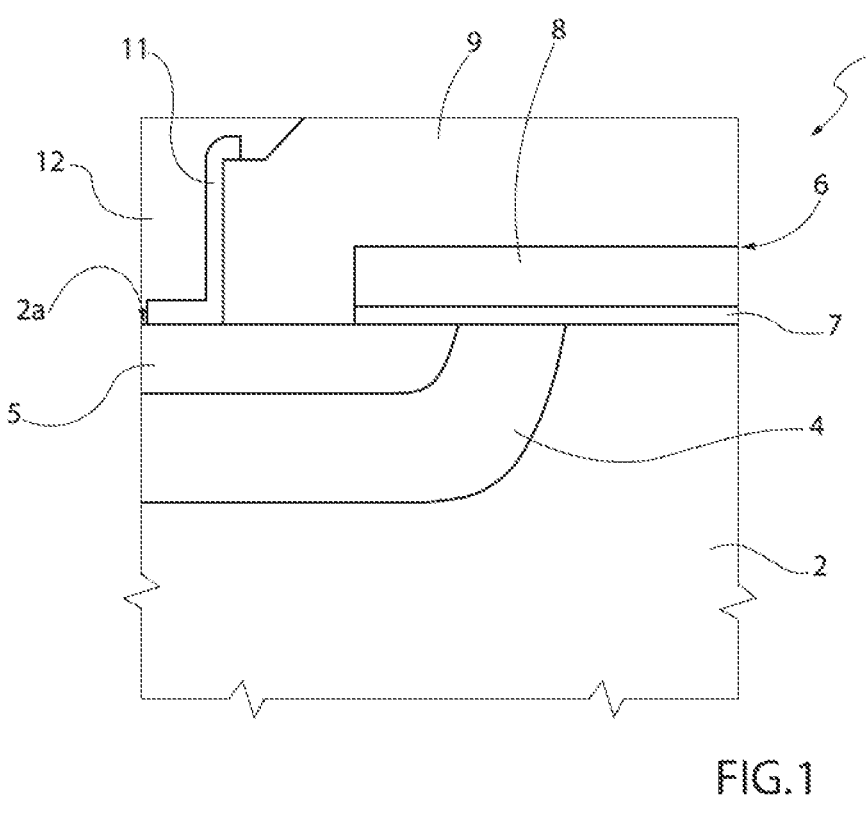
FIG. 1 is a cross-sectional view of a portion of a MOSFET device of a known type.
Figure 2:
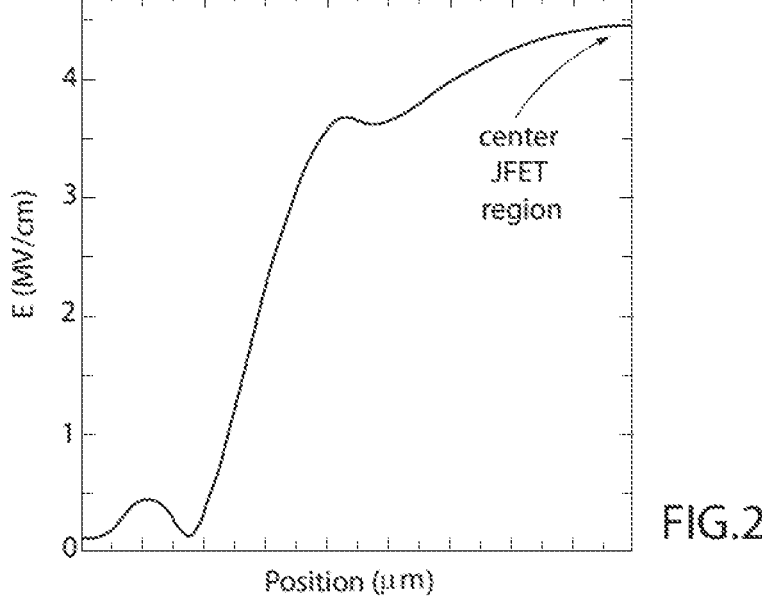
FIG. 2 shows the trend of an electrical field in a JFET region of the MOSFET device of FIG. 1.
Figure 3:
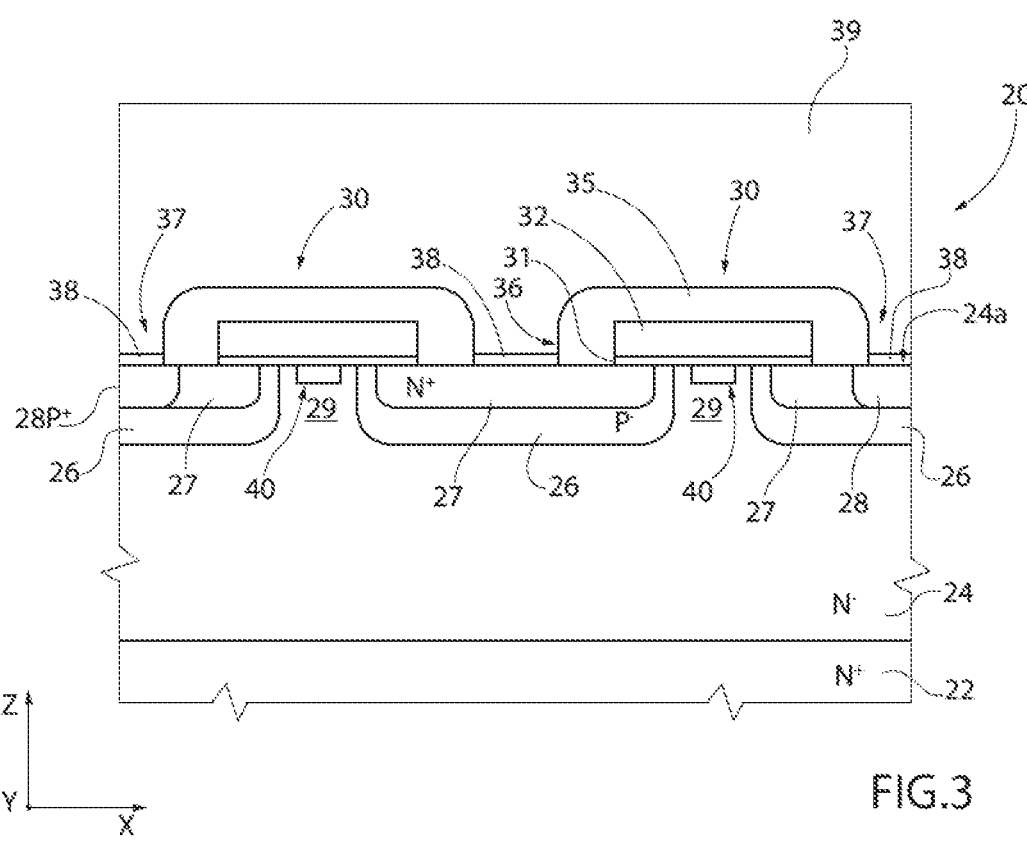
FIG. 3 is a cross-sectional view of a MOSFET device, according to one embodiment of the present solution.

FIG. 3 shows a MOSFET device 20, in particular an N-channel vertical transistor for high-power application.

The MOSFET device 20 is provided in a die of semiconductor material, in particular of silicon carbide (more in particular of a 4H-SiC polytype), and comprises a substrate (or structural layer) 22, which is heavily doped (with doping of an $N^+$ type), and a functional layer 24, arranged on the substrate 22 and having the same conductivity type as the substrate 22 and a lower concentration (for example, with a doping of an $N^-$ type). The functional layer 24, having a top surface 24a, is, for example, grown using an epitaxial technique on the substrate 22, and provides, together with the substrate 22, the drain of the MOSFET device 20 (i.e., a first current-conduction region of the same device); in particular, this functional layer 24 defines the so-called drift layer of the MOSFET device 20. A drain contact (here not illustrated), of an appropriate conductive material, is coupled underneath the substrate 22 (i.e., on the side opposite to the functional layer 24 along a vertical direction z).

A plurality of functional units or cells of the MOSFET device 20 are formed within an active area of the functional layer 24; these cells may, for example, have a generally strip-like extension in a longitudinal direction y (in a direction orthogonal to the transverse direction x of the cross-section of FIG. 3 and to the aforesaid vertical direction z, which corresponds to the thickness of the MOSFET device 20).

Each functional unit comprises a body well 26 having a conductivity opposite to that of the functional layer 24 (in the example, of a $P^-$ type), and a source region 27, arranged within the body well 26 at the top surface 24a, having the same conductivity type as the substrate 22 (and high concentration, in the example with doping of an $N^+$ type) and defining a second current-conduction region of the same device. Each body well 26 and source region 27 are shared, in the example, by two contiguous functional units of the MOSFET device 20.

A drain region 28, having the same conductivity type as the body wells 26 and high doping (in the example of a $P^+$ type), is moreover arranged within one or more of the same body wells 26 at the top surface 24a of the functional layer 24.

An inter-cell or JFET region 29 corresponds to the portion of the functional layer 24 arranged between two adjacent body wells 26 (in the horizontal direction, in the example along the transverse direction x) and between the top surface 24a of the functional layer 24 and the depth of the body wells 26 (in the vertical direction z).

Each functional unit further comprises a gate structure 30, arranged on the top surface 24a, overlapping the JFET region 29 and partially the body well 26 and the source region 27, in particular, being arranged on top of the channel region of the body well 26 (this channel region being delimited by the junction between the source region 27 and the body well 26 on one side, and by the junction between the body well 26 and the JFET region 29, on the other side). In the example, the gate structure 30 is shared by two adjacent cells of the MOSFET device 20.

In greater detail, the gate structure 30, which has, for example, a strip-like conformation along the longitudinal direction y, comprises a gate dielectric region 31, including, for example, silicon oxide ($SiO_2$) and arranged on the front surface 24a of the functional layer 24, and a gate electrode region 32, overlapping the gate dielectric region 31 and having substantially a same transverse dimensions as the same gate dielectric region 31.

A passivation layer 35, of a dielectric material, is arranged on the gate structures 30, and source-contact openings 36, at the underlying source regions 27, and body-contact openings 37, at the underlying drain regions 28, are defined through the same passivation layer 35. Electrical-contact regions 38 are arranged in the aforesaid source-contact openings 36 and body-contact openings 37, providing an electrical contact, of an Ohmic type, to the underlying source regions 27 and, respectively, drain regions 28.

The MOSFET device 20 further comprises a source-metallization layer 39, of a conformable type, for example, including Aluminium, arranged on the passivation layer 35 in the entire active area and in particular provided within the source-contact openings 36 and the body-contact openings 37 so as to contact the respective electrical-contact regions 38 and, consequently, the source regions 27 and drain regions 28.

In a way not illustrated, further electrical-contact regions are provided on the front, for electrical connection to the gate electrodes 32, which also extend through the passivation layer 35, and on the back, for electrical connection to the drain contact.

According to a particular aspect of the present solution, the MOSFET device 20 further comprises modified-doping regions 40, arranged within the surface portions of the functional layer 24 that separate adjacent body wells 26, i.e., within the JFET regions 29, at the top surface 24a, underneath respective gate structures 30, in particular underneath the corresponding gate dielectric regions 31.

The aforesaid modified-doping regions 40, in the embodiment illustrated, are arranged centrally with respect to the respective JFET regions 29; alternatively, as will be discussed and illustrated hereinafter, the same modified-doping regions 40 can extend transversally throughout the whole width of the respective JFET regions 40, terminating at the body wells 26 of the respective adjacent cells.

Furthermore, the aforesaid modified-doping regions 40 have a thickness, in the vertical direction z, smaller with respect to the thickness of the body wells 26 (i.e., with respect to the position along the vertical direction z of the body junctions between the same body wells 26 and the functional layer 24); the aforesaid thickness of the modified-doping regions 40 may be comprised between 10% and 50% of the thickness of the body wells 26.

In detail, the modified-doping regions 40 have the same conductivity type as the functional layer 24 and a net concentration of dopant reduced as compared to the concentration of the same functional layer 24. In particular, the doping concentration of the modified-doping regions 40 is comprised between 5% and 50%, for example, it is equal to 20%, of the doping concentration of the functional layer 24.

As will be discussed hereinafter, the aforesaid modified-doping regions 40 may be obtained by localized and partial deactivation of the N-type doping of the functional layer 24, in particular through localized implantations. This localized implantations may have an opposite conductivity type (of a P type), for example, with aluminium atoms or some other appropriate material, which provide a localized counter-doping for the functional layer 24; or they can cause localized damage to the functional layer 24.

Alternatively, the modified-doping regions 40 may be obtained by dedicated growth of an epitaxial layer, with suitable and specific doping, at the top surface 24a of the functional layer 24.

In any case, the presence of the aforesaid modified-doping regions 40, arranged underneath the gate structures 30 and within the JFET regions 29, enables reduction of the electrical field in the corresponding gate dielectric regions 31, in particular in conditions of reverse-biasing of the MOSFET device 20.

Figure 4:
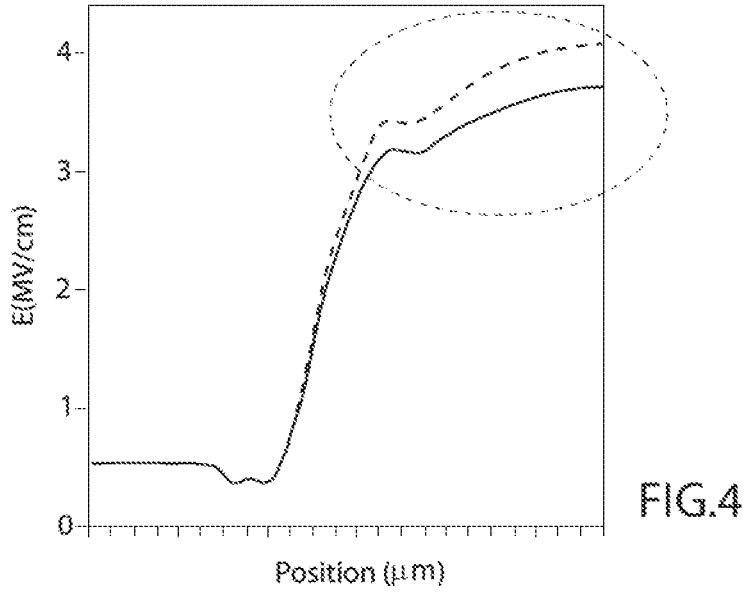
FIG. 4 shows the trend of an electrical field in a JFET region of the MOSFET device of FIG. 3, compared to the trend of the electrical field in a MOSFET device of a known type.

In this regard, FIG. 4 shows with a continuous line the trend, along the transverse direction, of the electrical field within the gate dielectric regions 31 in the presence of the modified-doping regions 40; represented, instead, with a dashed line, for the purposes of a comparison provided by way of example, is the trend of the electrical field in the same gate dielectric regions 31 in a traditional solution, where the modified-doping regions 40 are not present. From an examination of the two trends, the reduction of the electrical field in the JFET region 29 (highlighted by the circular box) is evident; advantageously, this reduction is sufficient to prevent dielectric breakdown and thus safeguards reliability of the MOSFET device 20.

It is underlined that the present Applicant has shown that the beneficial effect of reduction of the electrical field does not involve any substantial modification of the breakdown characteristics of the MOSFET device 20, the values of breakdown voltage and threshold voltage being in fact substantially unaltered. In other words, the reduction of the electrical field may be obtained with the breakdown voltage value and the threshold voltage value of the MOSFET device 20 being unchanged.

In addition, it is pointed out that it is sufficient to reduce the electrical field even by a small amount (for example, not higher than 10%) to guarantee a significant increase in the reliability of the MOSFET device 20. This is particularly important in so far as an excessive decrease in the electrical field could lead to an undesired increase of the on-state resistance (Ron) of the MOSFET device 20. It is thus possible to achieve in any case a good compromise between the beneficial effect of the reduction of the electrical field and the undesired increase of the on-state resistance.

Possible processes for manufacturing the MOSFET device 20, with particular regard to the formation of the aforesaid modified-doping regions 40, are now discussed.

In a first embodiment, the modified-doping regions 40 are obtained by an appropriate localized implantation carried out in the JFET regions 29 of the MOSFET device 20, aimed at partial deactivation of the N-type doping of the functional layer 24 of the same MOSFET device 20.

Figure 5A:
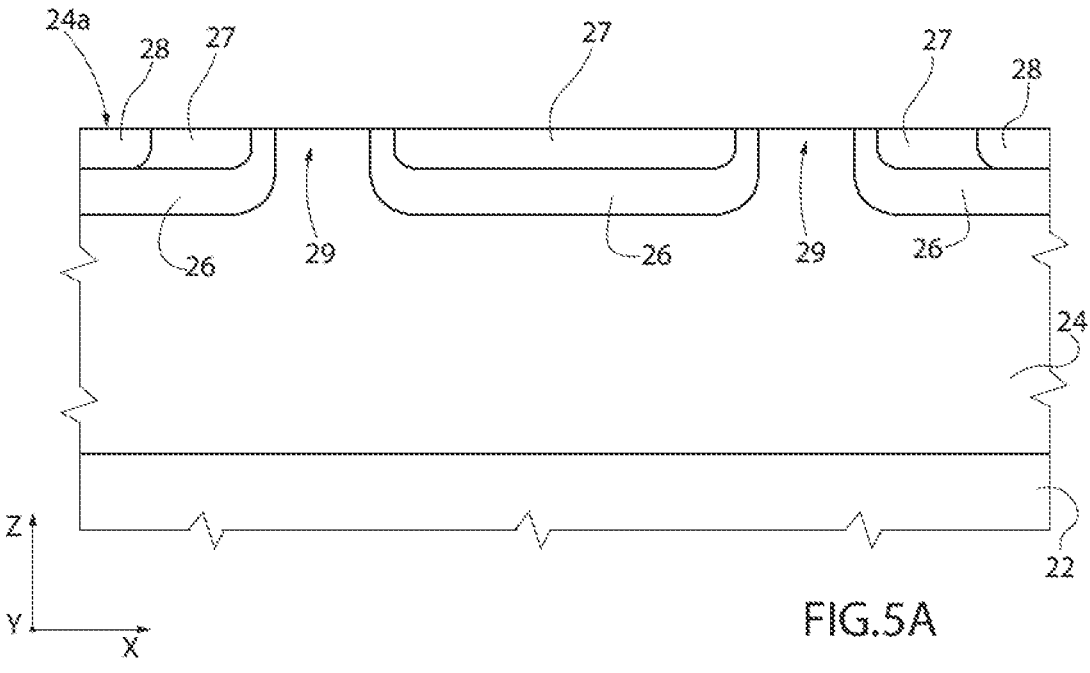
FIGS. 5A-5B are sectional views of a MOSFET device, in successive steps of a manufacturing process according to a first embodiment.

As shown in FIG. 5A, the manufacturing process first envisages, in a per se known manner, the formation of: the body wells 26 in the functional layer 24, by implantation of dopant atoms of a P type (for example, aluminium atoms); the source regions 27 within the same body wells 26, by a respective implantation of dopant atoms of an N type (for example, phosphorus atoms); and the drain regions 28 within one or more of the body wells 26 at the top surface 24a of the functional layer 24, by a respective implantation of dopant atoms of a P type with a high doping dose.

Figure 5B:
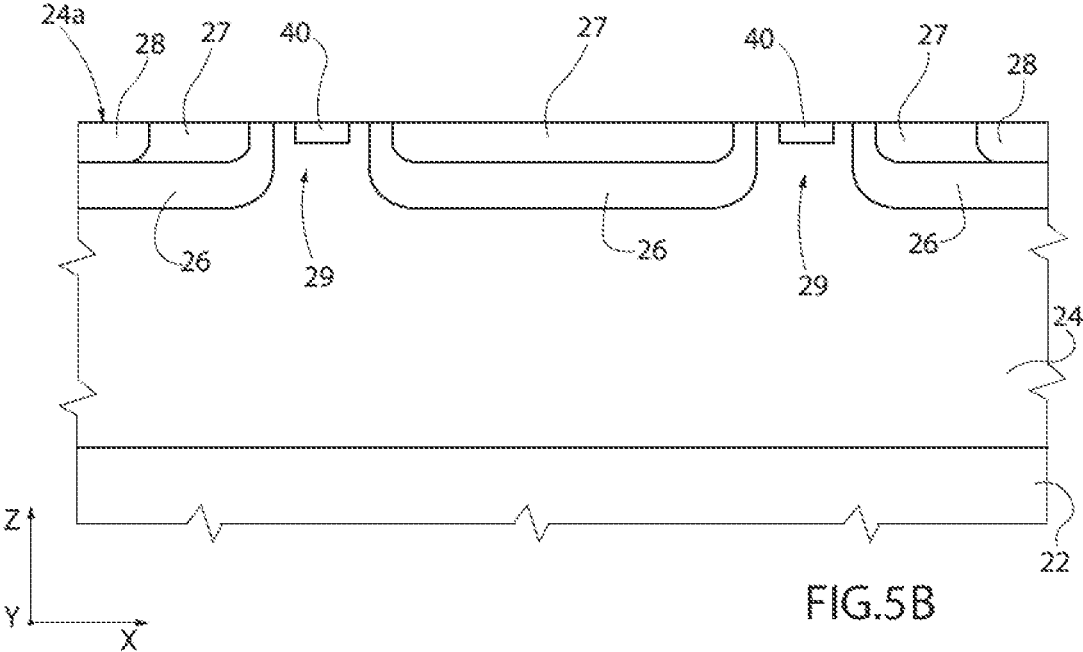

Next, FIG. 5B, according to an aspect of the present solution, the modified-doping regions 40 are provided by implantation of a P type (for example, with aluminium or boron atoms) in the JFET regions 29 between adjacent body wells 26; this implantation, with dopant atoms having a conductivity opposite to the conductivity of the functional layer 24 (in this case, being of an N type) performs a counter-doping and therefore a partial deactivation of the doping of the functional layer 24, thus leading to formation of the modified-doping regions 40, with reduced net doping concentration.

After thermal activation of the dopants, the process proceeds in a per se known manner, with the formation of the gate structures 30 on the functional layer 24 (by deposition and subsequent definition of a dielectric layer and of a metal layer for the formation of the gate dielectric regions 31 and of the gate electrodes 32 and then by deposition of the passivation layer 35). Moreover, the electrical-contact regions 38 are formed (on the front and on the back) to provide the source, gate and drain contacts, and then the source-metallization layer 39 is formed (thus defining the structure illustrated previously with reference to FIG. 3).

A variant of the aforesaid manufacturing process envisages that the formation of the modified-doping regions 40 is obtained by implantation in the JFET regions 29 of silicon atoms, designed to damage and thus deactivate the doping in the region of interest, with the final result of obtaining once again the reduced net doping concentration for the same modified-doping regions 40.

A different embodiment envisages, instead, formation of the aforesaid modified-doping regions 40 by epitaxial growth of a surface layer with the desired doping concentration (lower than the concentration envisaged for the functional layer 24).

Figure 6A:
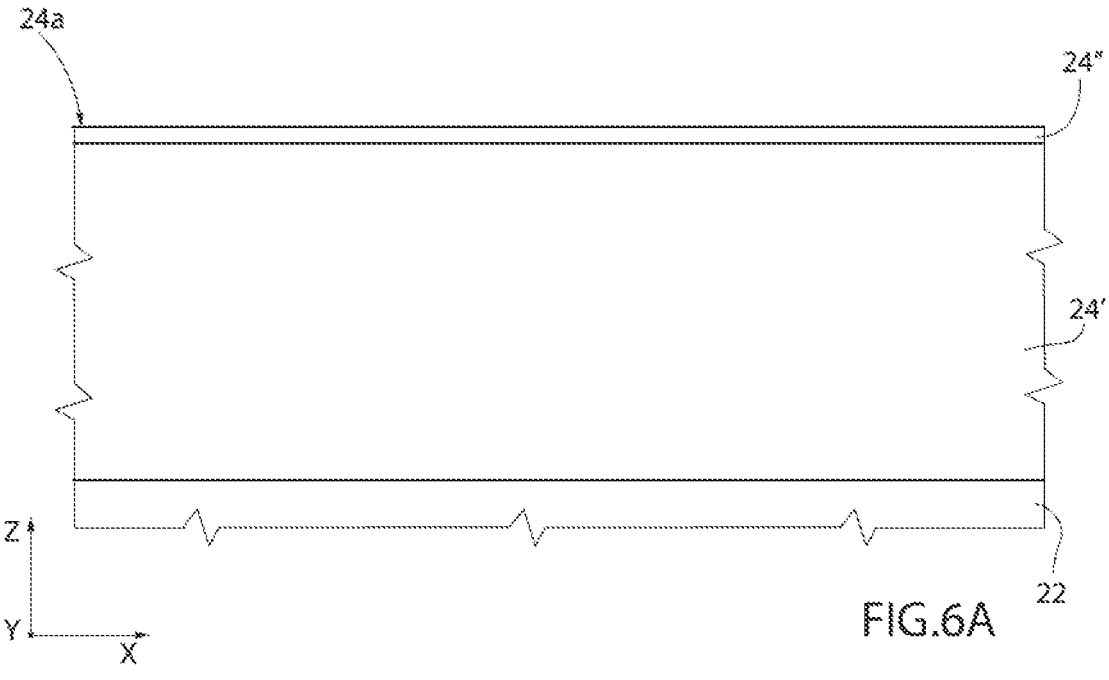
FIGS. 6A-6C are sectional views of a MOSFET device, in successive steps of a manufacturing process according to a different embodiment.

The above manufacturing process envisages, as shown in FIG. 6A, growth of a first epitaxial layer 24' on the substrate 22, having the desired conductivity and the desired doping concentration (in the example, of an N⁻ type) for the drift layer of the MOSFET device 20; it should be noted that this first epitaxial layer 24' has a thickness slightly smaller than the one desired as a whole for the functional layer 24 of the MOSFET device 20.

Then, as illustrated once again in FIG. 6A, according to an aspect of the present solution, a second thin epitaxial layer 24" is grown on the first epitaxial layer 24' (with a thickness such that, if added to the thickness of the first epitaxial layer 24', the desired thickness of the functional layer 24 is obtained). In particular, this second epitaxial layer 24", grown in a continuous manner and defining the front surface 24a of the functional layer 24, has a conductivity of an N type (like the functional layer 24) with a desired doping concentration reduced as compared to the first epitaxial layer 24', corresponding to the net doping concentration desired for the modified-doping regions 40; in other words, as illustrated hereinafter, the modified-doping regions 40 themselves are in this case defined by portions of the aforesaid second epitaxial layer 24".

Figure 6B:
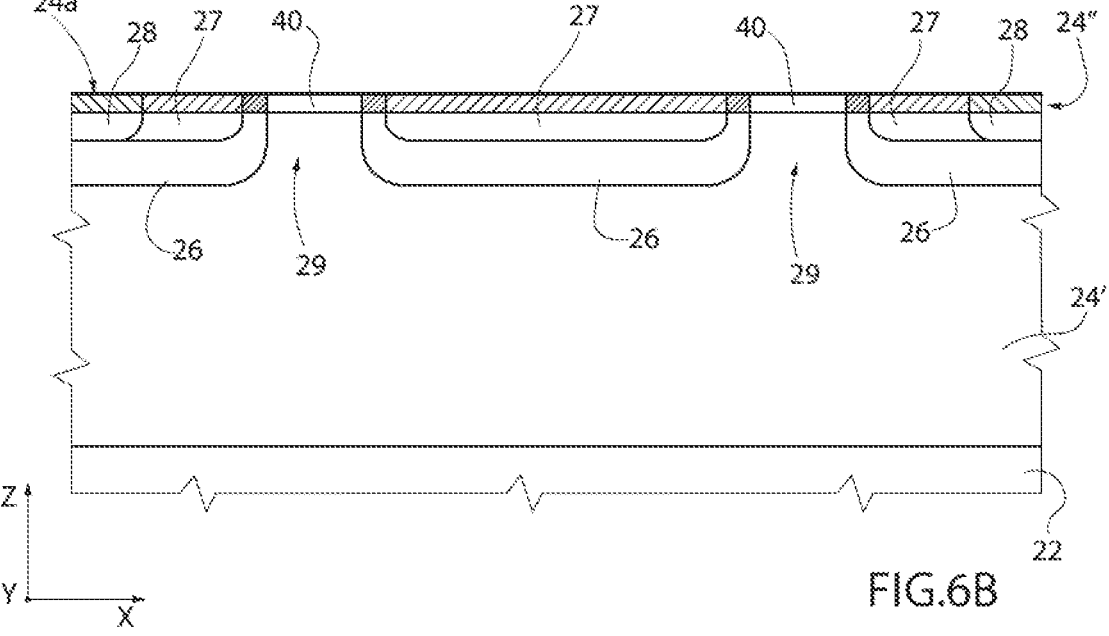

Next, as shown in FIG. 6B, the body wells 26, the source regions 27, and the drain regions 28 are formed by ion implantation. In particular, given the presence, at the front surface 24a, of the aforesaid second epitaxial layer 24", the density of surface doping of the implanted regions is appropriately adjusted to take into account the doping already present in the same second epitaxial layer 24" so as to obtain the desired dopant concentration (this adjustment of the density of surface doping is shown schematically in FIG. 6B).

It should be noted that, at the end of the aforesaid ion implantation, the modified-doping regions 40 remain between the body wells 26, being constituted by the portions of the second epitaxial layer 24" remaining between the same body wells 26 (in this case, these modified-doping regions 40 therefore extend transversally until they touch the body wells 26, throughout the entire width of the JFET regions 29 in the transverse direction x).

Figure 6C:
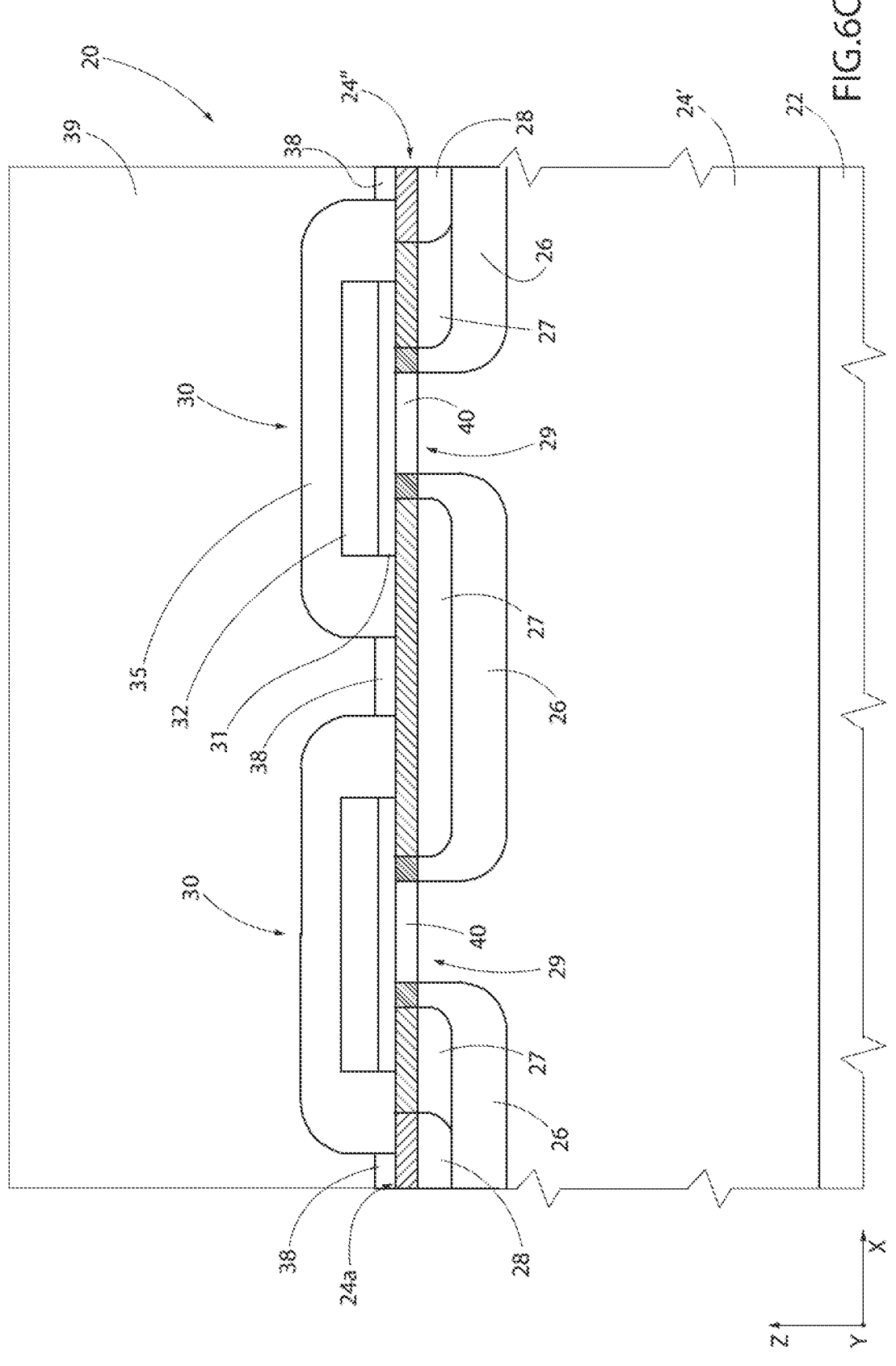

Also in this case, the process proceeds in a per se known manner, with the formation of the gate structures 30 on the functional layer 24, formation of the electrical-contact regions 38 to form the source contacts, gate contacts, and (in a way not illustrated here) drain contacts, and the formation of the source-metallization layer 39, thus defining the MOSFET device 20 illustrated in FIG. 6C.

Figure 7A:
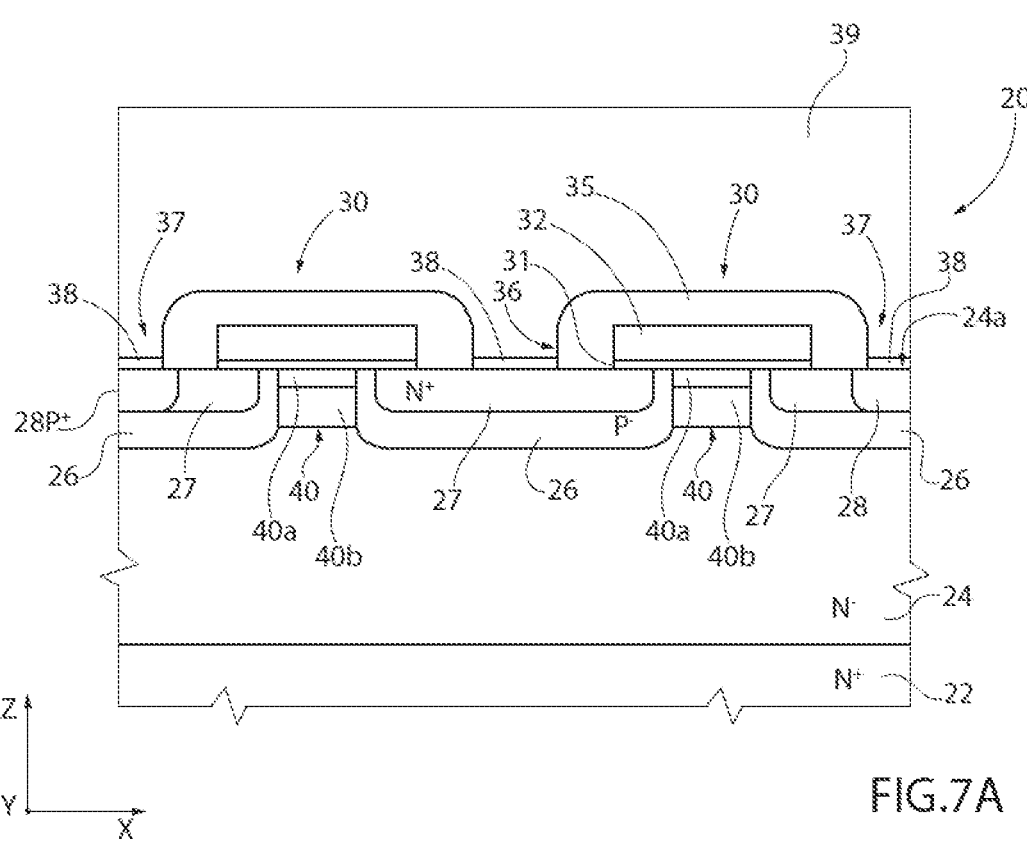
FIG. 7A is a cross-sectional view of a MOSFET device, according to a further embodiment of the present disclosure.
Figure 7B:
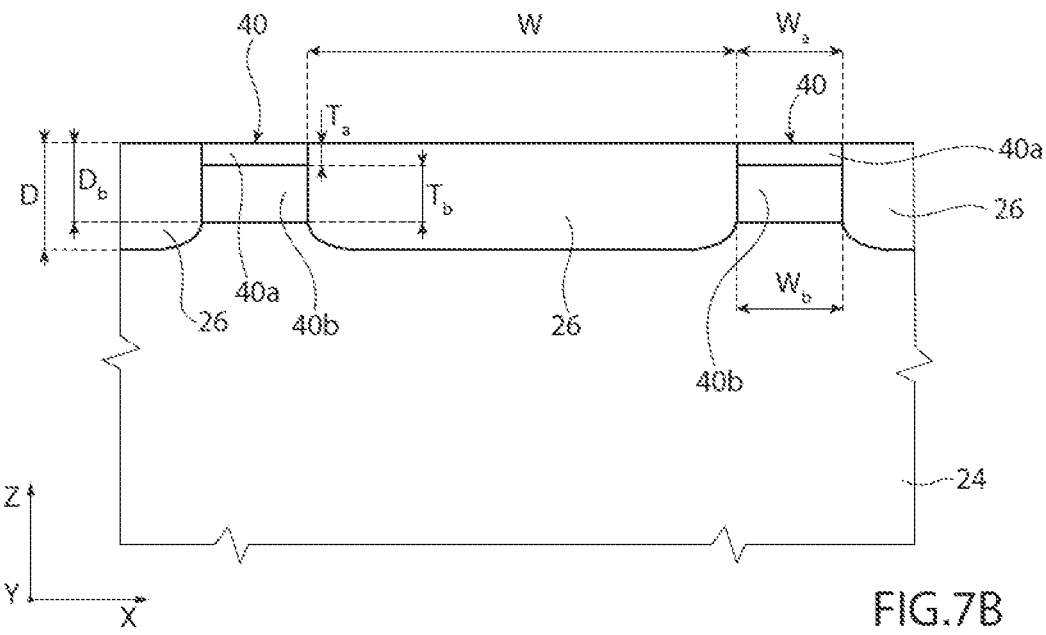
FIG. 7B is a simplified cross-sectional view of a portion of the MOSFET device of FIG. 7A.

A further embodiment of the present disclosure is now discussed, with reference to FIGS. 7A and 7B.

In this further embodiment, the modified doping regions 40 arranged in the JFET regions 29 of the MOSFET device 20 are constituted by the stack of a respective top layer 40a and of a respective bottom layer 40b underlying the top layer 40a.

The bottom layer 40b of the modified doping region 40 has a higher doping level or dopant concentration and the same conductivity type as the functional layer 24 (in the example N type).

In particular, the dopant concentration of the bottom layer 40b is comprised between 1.5 and 50 times the dopant concentration of the functional layer 24.

Moreover, a depth level of the bottom layer 40b with respect to the top surface 24a of the functional layer 24 along the vertical direction z, denoted as Db in FIG. 7B (where, for sake of simplicity, the source and drain regions 27, 28 of the MOSFET device 20 are not shown), is comprised between 0.5 and 1.2 times the respective depth level of the body wells 26, denoted with D in the same FIG. 7B.

The top layer 40a of the modified doping region 40 has a lower dopant concentration with respect to the bottom layer 40b, being e.g. comprised between 0.1 and 0.5 times the dopant concentration of the same bottom layer 40b.

The conductivity type of the top layer 40a may be the same or opposite as the one of the functional layer 24.

A thickness of the top layer 40a along the vertical direction z, denoted with Ta, is comprised between 0.1 and 0.5 times a respective thickness Tb of the bottom layer 40b.

The width of the bottom layer 40b of the modified doping region 40 (in the horizontal direction, in the example along the transverse direction x), denoted with Wb in FIG. 7B, can be lower or equal to the width W of the JFET region 29 (in the second case, the bottom layer 40b extending horizontally throughout the entire JFET region 29); likewise, a respective width Wa of the top layer 40a of the same modified doping region 40 (in the horizontal direction) can also be lower or equal to the width W of the JFET region 29, in a manner independent and uncorrelated to the bottom layer 40b (in other words, the widths Wa, Wb of the top and bottom layers 40a, 40b can be different and each equal or lower than the width of the JFET region 29).

The modified doping region 40 also in this embodiment may be arranged centrally with respect to the respective JFET region 29 (i.e. symmetrically with respect to a vertical plane crossing the same JFET region 29 at the centre thereof).

In this embodiment of the modified doping region 40, the presence of the bottom layer 40b allows to improve the conductivity characteristic and reduce the on-state resistance of the MOSFET device 20, while the top layer 40a, as discussed above, allows to decrease the electrical field on the gate dielectric region of the same MOSFET device 20.

Generally, similar considerations as those presented before also apply for the manufacturing of this embodiment of the modified doping region 40.

The bottom layer 40b can be obtained by epitaxial growth in a single step or in subsequent steps with respect to the functional layer 24; it can be obtained by implanting doping species of the same type as the same functional layer 24, in order to enrich the doping thereof.

The bottom layer 40*b* is formed with the above discussed depth and may reach the top surface 24*a* of the functional layer 24 or be buried therein.

The top layer 40*a* can be obtained by epitaxial growth in a single step or in subsequent steps with respect to the functional layer 24 and the bottom layer 40*b*; it can be obtained by implanting doping species of the same type as the same functional layer 24 or of a different type. The doping of the top layer 40*a* can be adjusted by implanting different species due to a counter-doping effect.

The top layer 40*a* is formed with the desired depth with respect to the top surface 24*a* of the functional layer 24, as described above. The same top layer 40*a* can be continuous or horizontally delimited in the JFET region 29, for example by means of photomasking and subsequent implantation steps before or after the formation of the body wells 26 and/or of the bottom layer 40*b*. If the width Wa of the top layer 40*a* is greater than the distance between the body wells 26, the doping of the same body wells 26 has to take into account the doping interaction with the same top layer 40 in the overlapping regions.

The advantages of the present solution emerge clearly from the foregoing description.

In any case, it is once again emphasized that the above solution enables improvement of the performance and reliability of MOSFET transistor devices built starting from a silicon carbide substrate (in particular, with a 4H-SiC polytype).

Specifically, the present solution allows to solve the problems of reliability linked to the high electrical fields developing at the interfaces between silicon oxide ($SiO_2$) and silicon carbide (4H-SiC), in particular centrally to the JFET regions of the MOSFET transistor device.

Advantageously, reduction of the aforesaid electrical field is obtained by keeping the breakdown characteristics of the MOSFET transistor device unaltered.

Moreover, embodiments with the modified doping region 40 formed by the stack of the top and bottom layers 40*a*, 40*b* provide the further advantage of improving the on resistance and conductivity characteristics of the MOSFET device 20, while at the same time offering a protection with respect to the electrical field for the gate dielectric regions.

The resulting MOSFET transistor device, obtained according to the present solution, can therefore find advantageous use in various fields of application, such as, for example, in power supplies and uninterruptible power sources (UPS) with power-factor correction (PFC), photovoltaic systems, energy-distribution systems, industrial motors and electric vehicles.

A MOSFET transistor device may be summarized as including: a functional layer (24) of silicon carbide, having a first conductivity type; gate structures (30) formed on a top surface (24*a*) of said functional layer (24) and each comprising a dielectric region (31) and an electrode region (32); body wells (26) having a second conductivity type, formed within said functional layer (24), separated from one another by surface-separation regions (29) of said functional layer (24); source regions (27) having said first conductivity type, formed within said body wells (26), laterally and partially underneath respective gate structures (30), characterized by further comprising modified-doping regions (40), arranged in the surface-separation regions (29) of said functional layer (24), underneath respective gate structures (30); said modified-doping regions (40) having a modified concentration of dopant as compared to the concentration of the functional layer (24).

The modified-doping regions (40) may be arranged centrally with respect to the surface-separation regions (29), underneath the dielectric regions (31) of the respective gate structures (30).

The modified-doping regions (40) may extend transversally throughout an entire width of the respective surface-separation regions (29), terminating at the body wells (26).

The modified-doping regions (40) may have said first conductivity type, with a net concentration of dopant reduced as compared to the concentration of the functional layer (24), comprised between 5% and 50% of the concentration of dopant of the functional layer (24).

The modified-doping regions (40) may have a thickness, in a vertical direction (z), transverse to the top surface (24*a*), smaller than the thickness of the body wells (26), being comprised between 10% and 50% of the thickness of the body wells (26).

The modified doping regions (40) may be constituted by a stack of a respective top layer (40*a*) and a respective bottom layer (40*b*) underlying the top layer (40*a*), wherein the bottom layer (40*b*) has a higher dopant concentration than the functional layer (24) and the top layer (40*a*) has a lower dopant concentration with respect to the bottom layer (40*b*).

The dopant concentration of the bottom layer (40*b*) may be comprised between 1.5 and 50 times the dopant concentration of the functional layer (24); and the dopant concentration of the top layer (40*a*) may be comprised between 0.1 and 0.5 times the dopant concentration of the bottom layer (40*b*).

A depth level (Db) of the bottom layer (40*b*) with respect to the top surface (24*a*) of the functional layer (24) may be comprised between 0.5 and 1.2 times a respective depth level (D) of the body wells (26); and a thickness ($T_a$) of the top layer (40*a*) may be comprised between 0.1 and 0.5 times a respective thickness ($T_b$) of the bottom layer (40*b*).

A width ($W_a$) of the top layer (40*a*) and a respective width ($W_b$) of the bottom layer (40*b*) may be, independently from each other, lower or equal to a respective width (W) of the surface-separation regions (29).

The surface-separation regions (29) may be JFET regions of said MOSFET transistor device (20).

A process for manufacturing a MOSFET transistor device (20) may be summarized as including: forming a functional layer (24) of silicon carbide, having a first conductivity type; forming gate structures (30) on a top surface (24*a*) of said functional layer (24), each comprising a dielectric region (31) and an electrode region (32); forming body wells (26) having a second conductivity type, within said functional layer (24), separated from one another by surface-separation regions (29) of said functional layer (24); forming source regions (27) having said first conductivity type, within said body wells (26), laterally and partially underneath respective gate structures (30), characterized by further comprising: forming modified-doping regions (40), arranged in the surface-separation regions (29) of said functional layer (24), underneath respective gate structures (30); said modified-doping regions (40) having a modified concentration of dopant as compared to the concentration of the functional layer (24).

Forming said modified-doping regions (40) may include performing a localized implantation in the surface-separation regions (29), aimed at partial deactivation or enrichment of the doping of the first conductivity type of the functional layer (24).

Performing a localized implantation may include performing an implantation with atoms of the second conductivity type in the surface-separation regions (29), said implantation providing a counter-doping and therefore a partial deactivation of the doping of the functional layer (24), thus leading to formation of the modified-doping regions (40) with reduced net doping concentration.

Performing a localized implantation may include performing an implantation in the surface-separation regions (29) of silicon atoms, designed to damage, and thus deactivate, the doping in the surface-separation regions (29), thus leading to the formation of the modified-doping regions (40) with reduced net doping concentration.

Forming said functional layer (24) may include forming, on a substrate (22), a first epitaxial layer (24') having said first conductivity type and a desired doping concentration for said functional layer (24); and forming said modified-doping regions (40) may include forming a second epitaxial layer (24") on the first epitaxial layer (24'), having said modified dopant concentration.

Forming said body wells (26) and forming said source regions (27) may include performing respective implantations in a surface portion of said functional layer, adjusting a density of surface doping of implanted regions so as to take into account the doping already present in the second epitaxial layer (24").

Said modified-doping regions (40) may be arranged centrally with respect to the surface-separation regions (29), underneath the dielectric regions (31) of the respective gate structures (30).

Said modified-doping regions (40) may extend transversally throughout an entire width of the respective surface-separation regions (29), terminating at the body wells (26).

Finally, it is clear that modifications and variations may be made to what has been described and illustrated herein, without thereby departing from the scope of the present disclosure.

In particular, it is emphasized that the present solution may find advantageous application in different silicon carbide MOSFET transistor devices, for example, in signal or power VDMOS devices, IGBTs (comprising a MOSFET transistor), IP (Intelligent Power) MOSFETs, for example, for automotive applications, in general in both N-channel and P-channel MOSFET transistors.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A MOSFET transistor device, comprising:
a functional layer of silicon carbide, having a first conductivity type;
gate structures formed on a top surface of said functional layer, each of the gate structures including a dielectric region and an electrode region;
body wells having a second conductivity type, formed within said functional layer, the body wells separated from one another by surface-separation regions of said functional layer;
source regions having said first conductivity type, the source regions formed within said body wells, laterally and partially underneath respective gate structures; and modified-doping regions, arranged in the surface-separation regions of said functional layer, underneath respective gate structures, said modified-doping regions having a modified concentration of dopant as compared to the concentration of the functional layer, wherein the modified-doping regions have said first conductivity type, with a net concentration of dopant reduced as compared to the concentration of the functional layer, between 5% and 50% of the concentration of dopant of the functional layer.

2. The device according to claim 1, wherein said modified-doping regions are arranged centrally with respect to the surface-separation regions, underneath the dielectric regions of the respective gate structures.

3. The device according to claim 1, wherein said modified-doping regions extend transversally throughout an entire width of the respective surface-separation regions, terminating at the body wells.

4. The device according to claim 1, wherein said modified-doping regions have a thickness, in a vertical direction, transverse to the top surface, that is between 10% and 50% of the thickness of the body wells.

5. The device according to claim 1, wherein said surface-separation regions are JFET regions of said MOSFET transistor device.

6. The device according to claim 1, wherein the modified doping regions include a stack of a respective top layer and a respective bottom layer underlying the top layer, wherein the bottom layer has a higher dopant concentration than the functional layer and the top layer has a lower dopant concentration with respect to the bottom layer.

7. The device according to claim 6, wherein the dopant concentration of the bottom layer is between 1.5 and 50 times the dopant concentration of the functional layer, and the dopant concentration of the top layer is between 0.1 and 0.5 times the dopant concentration of the bottom layer.

8. The device according to claim 6, wherein a depth level of the bottom layer with respect to the top surface of the functional layer is between 0.5 and 1.2 times a respective depth level of the body wells, and a thickness of the top layer is between 0.1 and 0.5 times a respective thickness of the bottom layer.

9. The device according to claim 6, wherein a width of the top layer and a respective width of the bottom layer are, independently from each other, less than or equal to a respective width of the surface-separation regions.

10. A process for manufacturing a MOSFET transistor device, comprising:
forming a functional layer of silicon carbide, having a first conductivity type;
forming gate structures on a top surface of said functional layer, each of the gate structures including a dielectric region and an electrode region;
forming body wells having a second conductivity type, within said functional layer, the body wells separated from one another by surface-separation regions of said functional layer;
forming source regions having said first conductivity type, within said body wells, laterally and partially underneath respective gate structures; and
forming modified-doping regions, arranged in the surface-separation regions of said functional layer, underneath respective gate structures, said modified-doping regions having a modified concentration of dopant as compared to the concentration of the functional layer, wherein forming said modified-doping regions comprises performing a localized implantation in the surface-separation regions, aimed at partial deactivation or enrichment of the doping of the first conductivity type of the functional layer.

11. The process according to claim 10, wherein performing a localized implantation comprises performing an implantation with atoms of the second conductivity type in the surface-separation regions, said implantation providing a counter-doping and therefore a partial deactivation of the doping of the functional layer, thus leading to formation of the modified-doping regions with reduced net doping concentration.

12. The process according to claim 10, wherein performing a localized implantation comprises performing an implantation in the surface-separation regions of silicon atoms, designed to damage, and thus deactivate, the doping in the surface-separation regions, thus leading to the formation of the modified-doping regions with reduced net doping concentration.

13. The process according to claim 10, wherein said modified-doping regions are arranged centrally with respect to the surface-separation regions, underneath the dielectric regions of the respective gate structures.

14. The process according to claim 10, wherein said modified-doping regions extend transversally throughout an entire width of the respective surface-separation regions, terminating at the body wells.

15. The process according to claim 10, wherein forming said functional layer comprises forming, on a substrate, a first epitaxial layer having said first conductivity type and a desired doping concentration for said functional layer, and wherein forming said modified-doping regions comprises forming a second epitaxial layer on the first epitaxial layer, having said modified dopant concentration.

16. The process according to claim 15, wherein forming said body wells and forming said source regions comprises performing respective implantations in a surface portion of said functional layer, adjusting a density of surface doping of implanted regions so as to take into account the doping already present in the second epitaxial layer.

17. A MOSFET transistor device, comprising:

a functional layer of silicon carbide, having a first conductivity type;

a first gate structure and a second gate structure spaced apart from each other on the functional layer;

a body well region of a second conductivity type in the functional layer extending in a U shape from the first gate structure to the second gate structure;

a source region of the first conductivity type in the functional layer above a middle portion of the body well region and below both the first gate structure and the second gate structure;

a first modified doping region of the first conductivity type in the functional layer below the first gate structure and spaced apart from the body well region and the source region and having a different doping concentration than the functional layer; and a second modified doping region of the first conductivity type in the functional layer below the second gate structure and spaced apart from the body well region and the source region and having a different doping concentration than the functional layer.

18. The device according to claim 17, wherein the first and second modified-doping regions are arranged centrally below the first and second gate structures, respectively.

* * * * *